US009200180B2

United States Patent
Banerjee et al.

(10) Patent No.: US 9,200,180 B2
(45) Date of Patent: Dec. 1, 2015

(54) CHEMICAL-MECHANICAL PLANARIZATION COMPOSITION HAVING BENZENESULFONIC ACID AND PER-COMPOUND OXIDIZING AGENTS, AND ASSOCIATED METHOD FOR USE

(75) Inventors: Gautam Banerjee, Chandler, AZ (US); Timothy Frederick Compton, Casa Grande, AZ (US); Junaid Ahmed Siddiqui, Richmond, VA (US); Ajoy Zutshi, Chandler, AZ (US)

(73) Assignee: Air Products and Chemicals, Inc., Allentown, PA (US)

( * ) Notice: Subject to any disclaimer, the term of this patent is extended or adjusted under 35 U.S.C. 154(b) by 317 days.

(21) Appl. No.: 12/419,619

(22) Filed: Apr. 7, 2009

(65) Prior Publication Data
US 2009/0261291 A1 Oct. 22, 2009

Related U.S. Application Data

(60) Division of application No. 11/212,628, filed on Aug. 29, 2005, now Pat. No. 7,514,363, which is a continuation-in-part of application No. 10/690,623, filed on Oct. 23, 2003, now Pat. No. 7,247,566.

(51) Int. Cl.
| | |
|---|---|
| *C09K 13/00* | (2006.01) |
| *C09G 1/02* | (2006.01) |
| *C11D 7/34* | (2006.01) |
| *C11D 11/00* | (2006.01) |
| *H01L 21/02* | (2006.01) |
| *H01L 21/321* | (2006.01) |

(52) U.S. Cl.
CPC .. *C09G 1/02* (2013.01); *C11D 7/34* (2013.01); *C11D 11/0047* (2013.01); *H01L 21/02074* (2013.01); *H01L 21/3212* (2013.01); *H01L 21/32125* (2013.01)

(58) Field of Classification Search
CPC ....... C09G 1/02; C11D 7/34; H01L 21/32125
USPC ...................... 252/79.1, 79.2, 79.3, 79.4, 79.5
See application file for complete search history.

(56) References Cited

U.S. PATENT DOCUMENTS

| | | | |
|---|---|---|---|
| 6,117,784 A | 9/2000 | Uzoh | |
| 6,527,622 B1 | 3/2003 | Brusic et al. | |
| 6,740,589 B2* | 5/2004 | Shimazu et al. | 438/691 |
| 6,750,128 B2 | 6/2004 | Kondo et al. | |
| 6,786,944 B2 | 9/2004 | Hattori et al. | |
| 6,852,632 B2 | 2/2005 | Wang et al. | |
| 6,872,329 B2 | 3/2005 | Wang et al. | |
| 6,899,596 B2 | 5/2005 | Antonelli et al. | |
| 2002/0098697 A1* | 7/2002 | Shimazu et al. | 438/691 |
| 2003/0181142 A1* | 9/2003 | De Rege Thesauro et al. | 451/36 |
| 2003/0190869 A1 | 10/2003 | Simon et al. | |
| 2003/0196386 A1 | 10/2003 | Hattori et al. | |
| 2003/0203624 A1 | 10/2003 | Sameshima et al. | |
| 2004/0014413 A1 | 1/2004 | Kawahashi et al. | |
| 2004/0063391 A1 | 4/2004 | Hosaka et al. | |
| 2004/0132305 A1 | 7/2004 | Nishimoto et al. | |
| 2004/0162011 A1 | 8/2004 | Konno et al. | |
| 2004/0166779 A1 | 8/2004 | Balijepalli et al. | |
| 2004/0173574 A1 | 9/2004 | Grunwald et al. | |
| 2004/0235407 A1 | 11/2004 | Grunwald et al. | |
| 2004/0266326 A1 | 12/2004 | Shiho et al. | |
| 2005/0026444 A1 | 2/2005 | Babu et al. | |
| 2005/0072524 A1* | 4/2005 | Mueller et al. | 156/345.11 |
| 2005/0090109 A1* | 4/2005 | Carter et al. | 438/692 |
| 2006/0046490 A1 | 3/2006 | Banerjee et al. | |

FOREIGN PATENT DOCUMENTS

JP      2002 087398      3/2002

OTHER PUBLICATIONS

"The Interaction Between Different Barrier Metals and the Copper Surface During the Chemical-Mechanical Polishing" by Zeidler et al. (Microelectronic Engineering, 1997).
"Polishing Surfaces for Integrated Circuits", by B. L. Mueller and J. S. Steckenrider, Chemtech, Feb. 1998, pp. 38-46.
Luo et al. in an article entitled "Stabilization of Alumina Slurry for Chemical-Mechanical Polishing of Copper" (Langmuir, 1996).
Kumar et al. in an article entitled "Chemical-Mechanical Polishing of Copper in Glycerol Based Slurries" (Materials Research Society Symposium Proceedings, 1996).
Gutmann et al. entitled "Chemical-Mechanical Polishing of Copper with Oxide and Polymer Interlevel Dielectrics" (Thin Solid Films, 1995).
Carpio et al. in an article entitled "Initial Study on Copper CMP Slurry Chemistries" (Thin Solid Films, 1995).
"Chemical-Mechanical Polish" by G. B. Shinn et al., Chapter 15, pp. 415-460, in Handbook of Semiconductor Manufacturing Technology, editors: Y. Nishi and R. Doering, Marcel, (2000).
"Characterization of Cu Chemical Mechanical Polishing by Electrochemical Investigations" by Ziedler et al., Micheoelectronic Engineering 33 (1997) 259-265.

* cited by examiner

*Primary Examiner* — Nadine Norton
*Assistant Examiner* — Mahmoud Dahimene
(74) *Attorney, Agent, or Firm* — Lina Yang

(57) ABSTRACT

A composition and associated method for chemical mechanical planarization (or other polishing) are described. The composition contains an abrasive, benzenesulfonic acid compound, a per-compound oxidizing agent, and water. The composition affords tunability of removal rates for metal, barrier layer materials, and dielectric layer materials in metal CMP processes. The composition is particularly useful in conjunction with the associated method for metal CMP applications (e.g., step 2 copper CMP processes).

15 Claims, No Drawings

CHEMICAL-MECHANICAL PLANARIZATION COMPOSITION HAVING BENZENESULFONIC ACID AND PER-COMPOUND OXIDIZING AGENTS, AND ASSOCIATED METHOD FOR USE

RELATED APPLICATIONS

This application is a divisional application of U.S. patent application. Ser. No. 11/212,628, filed on Aug. 29, 2005, now U.S. Pat. No. 7,514,363, which is a continuation-in-part of co-owned U.S. patent application Ser. No. 10/690,623, titled CMP METHOD FOR COPPER, TUNGSTEN, TITANIUM, POLYSILICON, AND OTHER SUBSTRATES USING ORGANOSULFONIC ACIDS AS OXIDIZERS filed Oct. 23, 2003, now U.S. Pat. No. 7,247,566, the disclosure of each of which is incorporated in its entirety for every allowable purpose.

FIELD OF THE INVENTION

This invention relates to an improved composition and process for the chemical mechanical polishing or planarization of semiconductor wafers. More particularly, it relates to such a composition and process tailored to meet more stringent requirements of advanced integrated circuit fabrication on substrates comprising copper and low-k dielectric materials.

The invention relates to chemical mechanical polishing of substrates using an abrasive and an aqueous fluid composition comprising benzenesulfonic acid and a per-compound oxidizing agent, preferably hydrogen peroxide, and particularly relates to a method of polishing substrates comprising copper, at least one barrier material, and at least one dielectric material using said chemical-mechanical polishing system comprising an abrasive and an aqueous composition comprising benzenesulfonic acid and at least one per-compound oxidizing agents.

BACKGROUND OF THE INVENTION

This invention relates generally to the chemical-mechanical polishing (CMP) of metal substrates on semiconductor wafers and slurry compositions therefor. In particular, the present invention relates to a CMP slurry composition which is characterized to enhance removal of barrier layer materials and low-k dielectric materials in relation to PETEOS dielectric layer materials and copper, and to provide tunability for the selective removal of barrier layer materials, copper, low-k dielectric materials, and PETEOS dielectric layer materials, during CMP processing of substrates comprised of metal, barrier layer materials, and dielectric layer materials. This invention is especially useful for metal CMP and most especially for step 2 copper CMP processes.

Chemical mechanical planarization (chemical mechanical polishing, CMP) for planarization of semiconductor substrates is now widely known to those skilled in the art and has been described in numerous patents and open literature publications. Some introductory references on CMP are "Polishing Surfaces for Integrated Circuits", by B. L. Mueller and J. S. Steckenrider, Chemtech, February, 1998, pages 38-46; and "Chemical-Mechanical Polish" by G. B. Shinn et al., Chapter 15, pages 415-460, in Handbook of Semiconductor Manufacturing Technology, editors: Y. Nishi and R. Doering, Marcel Deicker, New York City (2000).

In a typical CMP process, and in the process useful with the current invention, a substrate (e.g., a wafer) is placed in contact with a rotating polishing pad attached to a platen. A CMP slurry, typically an abrasive and chemically reactive mixture, is supplied to the pad during CMP processing of the substrate. Alternatively, a portion or all of the abrasive material can be disposed on the polishing pad. During the CMP process, the pad (fixed to the platen) and substrate are rotated while a wafer carrier system or polishing head applies pressure (downward force) against the substrate. The slurry accomplishes the planarization (polishing) process by chemically and mechanically interacting with the substrate film being planarized due to the effect of the downward force and the rotational movement of the pad relative to the substrate. Polishing is continued in this manner until the desired film on the substrate is removed with the usual objective being to effectively planarize the substrate. Typically metal CMP slurries contain an abrasive material, such as silica or alumina, suspended in an oxidizing, aqueous medium.

Silicon based semiconductor devices, such as integrated circuits (ICs), typically include at least one dielectric layer, metal wires and interconnects, and optionally one or more specialized layers such as diffusion barriers. Multilevel circuit traces, typically formed principally from aluminum, an aluminum alloy, copper, or a copper alloy are patterned onto the dielectric layer substrate. CMP processing is often employed to remove and planarize excess metal at different stages of semiconductor manufacturing. For example, one way to fabricate a multilevel copper interconnect or planar copper circuit traces on a dielectric substrate is referred to as the damascene process. In a semiconductor manufacturing process typically used to form a multilevel copper interconnect, metallized copper lines or copper vias are formed by electrochemical metal deposition followed by copper CMP processing. In a typical process, the interlevel dielectric (ILD) surface is patterned by a conventional dry etch process to form vias and trenches for vertical and horizontal interconnects and make connection to the sublayer interconnect structures. The patterned ILD surface typically is coated with an adhesion-promoting layer such as titanium or tantalum and/or a diffusion barrier layer such as titanium nitride or tantalum nitride over the ILD surface and into the etched trenches and vias. The adhesion-promoting layer and/or the diffusion barrier layer is then overcoated with copper, for example, by a seed copper layer and followed by an electrochemically deposited copper layer. Electro-deposition is continued until the structures are filled with the deposited metal. Finally, CMP processing is used to remove the copper overlayer, adhesion-promoting layer, and/or diffusion barrier layer, until a planarized surface with exposed elevated portions of the dielectric (silicon dioxide and/or low-k) surface is obtained. The vias and trenches remain filled with electrically conductive copper forming the circuit interconnects. The adhesion-promoting layer plus diffusion barrier layer is typically collectively referred to as the "barrier layer."

The dielectric layer comprises, for example, $SiO_2$ (doped or undoped with dopants such as boron or phosphorous), possibly with a layer of silicon nitride. Alternatively, interlevel dielectric layers may comprise, for example, an oxide, FSG, PSG, BPSG, PETEOS, HDP oxide, a silicon nitride, silicon oxynitride, silicon carbide, silicon carbo-oxynitride, a low dielectric constant material (for example, SILK, porous SiLK, teflon, low-K polymer (possibly porous), aerogel, xerogel, BLACK DIAMOND, HSQ, or any other porous glass material or a combination or stack thereof.

Not all dielectric materials respond equally to various CMP compositions and parameters. A commonly used dielectric material include "PETEOS", an $SiO_2$ film formed from tetraethyl-orthosilicate by chemical vapor deposition using plasma as a promoter. Commonly used lower dielectric constant materials generally have a dielectric constant below 3.0 and are generally referred to as "low-K dielectrics," which typically provide a carbon component and/or a porous component, and include commercial products such as: "SiLK"™, available from Dow Chemical Company, NY, USA; FLARE™, available from Honeywell, N.J., USA; microporous glasses such as Nanoglass™ (Porous $SiO_2$), available from Honeywell, Inc., NJ, USA; Black Diamond™ (Carbon-doped $SiO_2$), available from Applied Material, Calif., USA; Coral™ (Silicon carbide based dielectrics), available from Novellus Systems, Inc., CA, USA; and Xerogel, available from Allied Signal, N.J., USA.

A thin dielectric layer may be formed over an interlevel dielectric layer, which comprises, for example, silicon nitride, silicon carbide, SiCNO or a silicon oxide (for example, a high-density plasma oxide).

In addition, an added diffusion barrier/etch stop may be included near the top surface of a dielectric layer, such as $AlO_x$, AlN, $Si_3N_4$, $TiO_2$, $ZrO_2$, or $TaO_x$ that would be deposited after the barrier layer planarization process. This diffusion barrier is particularly useful if damascene processes are used to create the via or metallization to the contact.

Formation of metal structures which are situated above the contacts is considered to be part of the back end processes. The back end process steps may be those standard in the semiconductor industry. The metallization may be, for example, either Al or Cu based. The Al is preferably etched while the Cu is preferably used in a damascene approach. However, etching Cu and Al formed in a damascene process is also possible. An exemplary aluminum metallization will preferably have CVD tungsten plugs or Al plugs, and the Al will preferably be Cu-doped for improved electromigration resistance. Metal diffusion barriers for Al may include, for example, TiN and/or Ti. Exemplary copper metallization may have, for example, Cu or W plugs with either Ti, TiN (titanium nitride), TiSiN, Ta, tantalum nitride, and/or TaSiN diffusion barriers.

The interconnects and the metal lines preferably comprise the same material. Plugs and conductors comprise a metal material, for example, copper, aluminum, titanium, TiN, tungsten, tungsten nitride, or any combination or stack thereof. A barrier/liner may be formed between the plug and the respective interlevel dielectric layer. If formed, the barrier/liner layer comprises, for example, Ti, TiN, W, tungsten nitride, Ta, tantalum nitride, any conventional barrier/liner layer, or any combination or stack thereof).

In addition, various metals and metal alloys have been used at different stages of semiconductor manufacturing, and an exemplary selection of metals which may be contacted by a polishing process include tungsten, aluminum, copper, tantalum, tantalum nitride, titanium, titanium nitride, ruthenium, platinum, iridium, and combinations thereof. Other structures can also be present, providing other materials such as one or more noble metals, polysilicon, silicon nitride, and other minerals, metals, and compounds. For a typical wafer undergoing copper damascene process, the insulating layers typically comprise silica, silicon nitride, and low-k films including carbon-doped oxides; the barrier layers disposed between copper and dielectric material typically comprise Ta, TaN, Ti, TiN, or various mixtures and combinations thereof.

A multi-step copper CMP process may be employed to achieve local and global planarization in the production of IC chips, referred to as a step 1 copper CMP process, followed by a barrier layer CMP process. In relation to copper CMP, the current state of this technology involves use of a two-step process. During step 1 of a copper CMP process, the overburden copper is removed and planarized. Then step 2 of the copper CMP process follows to remove the barrier layer materials and achieve both local and global planarization. The barrier layer CMP process is frequently referred to as a barrier or step 2 copper CMP process. The ratio of the removal rate of copper to the removal rate of dielectric material is called the "selectivity" for removal of copper in relation to dielectric material during CMP processing of substrates comprised of copper, barrier layer materials, and dielectric material. The ratio of the removal rate of barrier layer materials to the removal rate of copper is called the "selectivity" for removal of barrier layer materials in relation to copper during CMP processing of substrates comprised of copper, barrier layer materials, and dielectric materials. Barrier layer materials include tantalum, tantalum nitride, tungsten, noble metals such as ruthenium and ruthenium oxide, and combinations thereof.

When CMP slurries over-polish copper layers they may create a depression or "dishing" effect in the copper vias and trenches. This feature distortion is unacceptable due to lithographic and other constraints in semiconductor manufacturing. Another feature distortion that is unsuitable for semiconductor manufacturing is called "erosion." Erosion is the topography difference between a field of dielectric and a dense array of copper vias or trenches. In CMP, the materials in the dense array may be removed or eroded at a faster rate than the surrounding field of dielectric. This causes a topography difference between the field of dielectric and the dense copper array.

A number of systems for CMP of copper have been disclosed. A few illustrative examples are listed next. Kumar et al. in an article entitled "Chemical-Mechanical Polishing of Copper in Glycerol Based Slurries" (*Materials Research Society Symposium Proceedings,* 1996) disclose a slurry that contains glycerol and abrasive alumina particles. An article by Gutmann et al. entitled "Chemical-Mechanical Polishing of Copper with Oxide and Polymer Interlevel Dielectrics" (*Thin Solid Films,* 1995) discloses slurries based on either ammonium hydroxide or nitric acid that may contain benzotriazole (BTA) as an inhibitor of copper dissolution. Luo et al. in an article entitled "Stabilization of Alumina Slurry for Chemical-Mechanical Polishing of Copper" (*Langmuir,* 1996) discloses alumina-ferric nitrate slurries that contain polymeric surfactants and BTA. Carpio et al, in an article entitled "Initial Study on Copper CMP Slurry Chemistries" (*Thin Solid Films,* 1995) disclose slurries that contain either alumina or silicon particles, nitric acid or ammonium hydroxide, with hydrogen peroxide or potassium permanganate as an oxidizer.

Generally, after removal of overburden copper in step 1, polished wafer surfaces have non-uniform local and global planarity due to differences in the step heights at various locations of the wafer surfaces. Low density features tend to have higher copper step heights whereas high density features tend to have low step heights. Due to differences in the step heights after step 1, selective slurries are highly desirable for step 2 copper CMP for the selective removal of barrier layer materials in relation to copper and for the selective removal of dielectric materials in relation to copper.

Chemical mechanical polishing slurries have two actions, a chemical component and a mechanical component. In the case of CMP of most metals, the chemical action is generally considered to take one of two forms. In the first mechanism, the chemicals in the solution react with the metal layer to continuously form an oxide layer on the surface of the metal. This generally requires the addition of an oxidizer such as hydrogen peroxide, ferric nitrate, etc to the solution. Then the mechanical abrasive action of the particles continuously and simultaneously removes this oxide layer. A judicious balance of these two processes obtains optimum results in terms of removal rate and polished surface quality. In the second mechanism, no protective oxide layer is formed. Instead, the constituents in the solution chemically attack and dissolve the metal, while the mechanical action is largely one of mechanically enhancing the dissolution rate by such processes as continuously exposing more surface area to chemical attack, raising the local temperature (which increases the dissolution rate) by the friction between the particles and the metal and enhancing the diffusion of reactants and products to and away from the surface by mixing and by reducing the thickness of the boundary layer.

There are a number of theories as to the mechanism for chemical mechanical polishing of copper. An article by Zeidler et al. (*Microelectronic Engineering*, 1997) proposes that the chemical component forms a passivation layer on the copper changing the copper to a copper oxide. The copper oxide has different mechanical properties, such as density and hardness, than metallic copper and passivation changes the polishing rate of the abrasive portion. The above article by Gutmann et al. suggests that the mechanical component abrades elevated portions of copper, and the chemical component then dissolves the abraded material. The chemical component may also passivate recessed copper areas minimizing dissolution of those portions.

Various U.S. patents and published applications that mention some form or sulfonic acids in a CMP system include:

U.S. Pat. Nos. 6,527,622 and 6,852,632, and U.S. Patent Publication No. 2003/0181142, each describing a CMP slurry for noble metal;

U.S. Pat. No. 6,750,128 describing a CMP slurry for copper/barrier materials comprising hydrogen peroxide and e.g., nitrobenzene sulfonic acid;

U.S. Patent Publication No. 2004/0173574, No. 2003/0203624 and 2004/0235407 describe a chemical metal polishing composition comprising an oxidizer which is an organic nitro compound, e.g., m-nitrobenzene sulfonic acid.

U.S. Patent Publication No. 2005/0090109 describing a CMP composition comprising an organosulfonic acid oxidizer, wherein the fluid composition can further comprise an abrasive and a hydroxylamine compound;

U.S. Pat. No. 6,117,784 describing a method of etching the exposed copper seed layer not covered by the electroplated or electrolessly plated copper using an etchant that preferentially etches said copper seed layer at a rate higher than that for the electroplated or electrolessly plated metal; and wherein said etchant comprises a persulfate, a surfactant, and optionally further contains stabilized 1-5% hydrogen peroxide and a sulfur-containing compound such as benzene sulfonic acid;

U.S. Pat. No. 6,740,589 describing a CMP composition for polishing copper and a barrier comprising an aqueous solvent, an amino acid having two or more nitrogen atoms, and a copper-polishing accelerator selected from the group consisting of a large number of inorganic acids and organic acids, one of which is benzenesulfonic acid. The polishing composition optionally contains an oxidizing agent such as hydrogen peroxide;

A number of applications describes CMP compositions having an oxidizer, e.g., hydrogen peroxide, and a sulfonic acid (e.g., para-toluene sulfonic acid) or a anionic sulfonate-containing surfactant (e.g., dodecyl-benzene sulfonic acid or alkyl-benzene sulfonic acids). Included are U.S. Patent Publication Nos. 2004/0014413; 2004/0063391; 2004/0162011; 2004/0166779; 2004/0266326; 2005/0026444; 2004/0132305; 2003/0196386; and also U.S. Pat. No. 6,786,944.

BRIEF SUMMARY OF THE INVENTION

A method of step 2 chemical-mechanical planarization, said method comprising the steps of: A) providing a substrate comprising copper, at least one dielectric material, and at least one barrier material; and B) movably contacting the substrate with a polishing pad, an abrasive material, and a fluid composition comprising or consisting essentially of about 0.1% to about 8% by weight based on the total weight of the fluid of a per-type oxidizing compound, between 0.1% and 5% by weight based on the total weight of the fluid of benzenesulfonic acid and/or salt thereof and water, wherein the composition has a pH ranging from 4.5 to about 12, and wherein the composition is substantially free of one amino acid having two or more nitrogen atoms. In a preferred variant of the above method, the substrate comprises a first dielectric material PETEOS and a low-k dielectric material, for example where the low-K material is a carbon-doped silica oxide. In a preferred variant of any of the above methods, the per-type oxidizing compound is hydrogen peroxide. In a preferred variant of any of the above methods, the per-type oxidizing compound comprises hydrogen peroxide and is present in an amount between about 0.5% to about 6%, wherein the benzenesulfonic acid is present in an amount between about 0.5% to about 5%, and the abrasive comprises silica having a median weight average diameter of between 20 nanometers and about 200 nanometers in diameter suspended in the fluid composition and present in an amount between 0.1% and 20% by weight based on the total weight of the suspended abrasive and of the fluid composition, wherein the pH of the fluid composition is between about 5 to about 11. In a variant of any of the above methods, the per-type oxidizing compound comprises hydrogen peroxide and is present in an amount between about 0.5% to about 5%, wherein the benzenesulfonic acid is present in an amount between about 0.5% to about 3%, and the abrasive comprises silica having a median weight average diameter of between 20 nanometers and about 200 nanometers in diameter suspended in the fluid composition and present in an amount between 0.5% and 20% by weight based on the total weight of the suspended abrasive and of the fluid composition, wherein the pH of the fluid composition is between about 6 to about 11. In yet another embodiment, the per-type oxidizing compound is hydrogen peroxide present in an amount between about 0.5% to about 5%, wherein the benzenesulfonic acid is present in an amount between about 0.5% to about 3%, and the abrasive is colloidal silica suspended in the fluid composition and present in an amount between 0.5% and 20% by weight based on the total weight of the suspended abrasive and of the fluid composition, wherein the pH of the fluid composition is between about 7 to about 10.5. Preferably the oxidizing compound consists essentially of a peroxide compound. In a variant of the above methods, the fluid composition consists essentially of: a peroxide compound; water; benzenesulfonic acid; optionally an acid that is not a sulfonic acid, a base, or both; and optionally suspended abrasive material. In an alternative variant of the above methods, the fluid composition consists essentially of a peroxide compound; water; benzenesulfonic acid; optionally suspended abrasive material; optionally an acid that is not a sulfonic acid, a base, or both; and optionally one or more additives selected from the group consisting of a surfactant, a chelator, a fluorine-containing compound. In another alternative variant of the above methods which recite a chelator, the chelator is selected from ethylenediaminetetracetic acid, N-hydroxyethylethylenediaminetriacetic acid, nitrilotriacetic acid, diethylenetriaminepentacetic acid, ethanoldiglycinate, glycine, tricine, citric acid, 2,3-butanedione dioxime (dimethylglyoxime) and mixtures thereof. In an alternative variant of the above methods, the fluid composition consists essentially of a peroxide compound; water; benzenesulfonic acid; optionally suspended abrasive material; optionally an acid that is not a sulfonic acid; a base selected from non-polymeric nitrogen-containing compounds, a salt selected from ammonium persulfate, potassium persulfate, potassium sulfite, potassium carbonate, ammonium nitrate, potassium hydrogen phthalate, a salt of hydroxylamine, or any combination thereof. In another alternative variant of the above methods, the fluid composition additionally comprises one or more of: 1) an acid that is not a sulfonic acid; 2) a base selected from non-polymeric nitrogen-containing compounds, an alkali hydroxide, or mixture thereof and biological agents, wherein the pH of the fluid composition is around about 6 to 9. In any of the above embodiments not in conflict, the fluid composition additionally comprises a water-miscible solvent. In any of the above embodiments not in conflict, the fluid composition additionally comprises hydroxylamine, an alkyl-substituted hydroxylamine, or any salt thereof. In any of the above embodiments not in conflict, the composition is substantially free of persulfates and of amino acid having two or more nitrogen atoms. In any of the above embodiments not in conflict, the substrate comprises silica, such as PETEOS and also in other areas of the substrate a low-k material, and the barrier layer comprises at least one of a nitride of titanium, and oxynitride of titanium, a nitride of tantalum, or an oxynitride of tantalum, collectively called the barrier layer compound, wherein the copper/barrier layer compound selectivity is between 0.66 and 1.5, wherein the PETEOS/barrier layer compound selectivity is between 0.66 and 1.5, and wherein the copper/low-K dielectric selectivity is between 0.66 and 1.5. The polishing composition is useful in chemical-mechanical polishing (CMP), and especially in copper CMP for the planarization of silicon based semiconductor devices, such as integrated circuits and memory devices.

In another embodiment, the invention encompasses a chemical-mechanical planarization composition consisting essentially of an abrasive; 0.5% to 7% of a per-type oxidizing compound; between 0.1% and 4% of benzenesulfonic acid and/or salt thereof; water; and optionally one or more additives selected from an acid, a base, a salt, a chelator, a biocidal agent, a fluorine-containing compound, or any mixture thereof, wherein the composition has a pH ranging from 5 to about 11. The per-type oxidizing compound is advantageously a peroxide compound, for example hydrogen peroxide.

In one embodiment, the invention is a chemical-mechanical planarization composition comprising:
 a) an abrasive;
 b) benzenesulfonic acid;
 c) a per-compound oxidizing agent; and
 d) water;
  wherein the abrasive is present at a weight percent level in the composition ranging from about 0.05 weight % to about 20 weight %, wherein benzenesulfonic acid is present at a weight percent level in the composition ranging from about 0.5 weight % to about 2 weight %, and wherein the per-compound oxidizing agent is present at a level ranging from 1 weight % to 5 weight % of the total weight of the composition, wherein the composition has a pH ranging from 5 to 11.

The polishing composition is useful in chemical-mechanical polishing (CMP), and especially in metal CMP for the planarization of silicon based semiconductor devices, such as integrated circuits and memory devices. In another embodiment, the invention is a chemical-mechanical planarization composition comprising:
 a) an abrasive;
 b) benzenesulfonic acid;
 c) hydrogen peroxide; and
 d) water;
  wherein the abrasive is present at a weight percent level in the composition ranging from about 0.05 weight % to about 20 weight %, wherein benzenesulfonic acid is present at a weight percent level in the composition ranging from about 0.5 weight % to about 2 weight %, and wherein hydrogen peroxide is present at a level ranging from 1 weight % to 5 weight % of the total weight of the composition, wherein the composition has a pH ranging from 5 to 11.

In a further embodiment, the invention is a chemical-mechanical planarization composition comprising:
 a) a silica abrasive;
 b) benzenesulfonic acid;
 c) hydrogen peroxide; and
 d) water;
  wherein the silica abrasive is present at a weight percent level in the composition ranging from about 0.05 weight % to about 20 weight %, wherein benzenesulfonic acid is present at a weight percent level in the composition ranging from about 0.5 weight % to about 2 weight %, and wherein hydrogen peroxide is present at a level ranging from 1 weight % to 5 weight % of the total weight of the composition, wherein the composition has a pH ranging from 5 to 11.

In an additional embodiment, the invention is a method of step 2 chemical-mechanical planarization, said method comprising the steps of:
 A) placing a substrate comprising copper, at least one dielectric material and at least one barrier material in contact with a polishing pad;
 B) delivering a chemical-mechanical planarization composition comprising a) an abrasive; b) benzenesulfonic acid; c) a per-compound oxidizing agent; and d) water; and
 C) polishing the substrate with the polishing step 2 copper chemical-mechanical planarization composition;
  wherein the abrasive is present at a weight percent level in the composition ranging from about 0.05 weight % to about 20 weight %, wherein the benzenesulfonic acid is present at a weight percent level in the composition ranging from about 0.5 weight % to about 2 weight %, and wherein the per-compound oxidizing agent is present at a level ranging from 1 weight % to 5 weight % of the total weight of the composition, wherein the composition has a pH ranging from 5 to 11.

In an additional embodiment, the invention is a method of step 2 copper chemical-mechanical planarization, said method comprising the steps of:
 A) placing a substrate comprising copper, at least one dielectric material and at least one barrier material in contact with a polishing pad;
 B) delivering a chemical-mechanical planarization composition comprising a) an abrasive; b) benzenesulfonic acid; c) hydrogen peroxide; and d) water; and
 D) polishing the substrate with the polishing step 2 copper chemical-mechanical planarization composition;

wherein the abrasive is present at a weight percent level in the composition ranging from about 0.05 weight % to about 20 weight %, wherein benzenesulfonic acid is present at a weight percent level in the composition ranging from about 0.5 weight % to about 2 weight %, and wherein hydrogen peroxide is present at a level ranging from 1 weight % to 5 weight % of the total weight of the composition, wherein the composition has a pH ranging from 5 to 11. Optionally, other additives may be included.

DETAILED DESCRIPTION OF THE INVENTION

It has been found that CMP polishing compositions comprising an abrasive, and specific ranges of benzenesulfonic acid and a per-compound oxidizing agent in water possess high removal rates for barrier layer material (e.g., tantalum nitride and tantalum) and low-k dielectric layer materials (e.g., Black Diamond®), in relation to metal (e.g., copper) and PETEOS dielectric materials; and provide tunability for the selective removal of barrier layer materials, copper, low-k dielectric layer materials, and PETEOS dielectric layer materials; during CMP processing. Consequently these polishing compositions are particularly useful in copper CMP processing generally, and especially in step 2 copper CMP.

A large number of aromatic or cyclic sulfonic acid-containing compounds were disclosed in co-owned pending U.S. patent application Ser. No. 10/690,623, the disclosure of which is incorporated here for every allowable purpose. These included generally organosulfonic acid oxidizers which comprise at least one sulfonate substituted onto a ring structure. The preferred class of sulfonic acid oxidizers in the parent application are those comprising one or more sulfonate moieties directly attached to a single- or multi-cyclic aromatic ring. Another useful class of sulfonic acid oxidizers are those comprising one or more sulfonate moieties directly attached to a carbon atom in a single-ring or double-ring structure, where the ring(s) can be cyclic (i.e., consist of a plurality of carbon atoms) or heterocyclic (i.e., comprise carbon atoms and at least one heteroatom, e.g., at least one N, at least one S, at least one O, or any combination thereof). Without being bound by theory, it is believed that the proximity of the ring increases the activity of the sulfonate moiety. In more preferred embodiments, the organosulfonic acid can have a ring structure with a sulfonate moiety directly attached and at least one other functional moiety (referred to herein as "polar substituents" or "polar groups,") e.g., another sulfonate moiety, a sulfate moiety, an amino moiety, a nitro moiety, a nitroso moiety, a hydroxyl moiety, a carboxylate moiety (COOH, COOR, or COO—R+), an alkoxy moiety such as a methoxy group, or the like, or a combination thereof, also attached to the ring structure. When there is only one other functional moiety attached to the ring structure, it will advantageously be at the ortho- or meta-position (and not in a para-position) in relation to the sulfonate moiety, most preferably at the ortho-position. Steric placement of secondary functional polar groups on the ring structure is important. It is also preferred that the polar group(s) in the ortho and/or meta position(s) is (are) substituted directly onto carbon atoms in the ring, as opposed to being substituted on heteroatoms in a ring structure, and as opposed to be separated from the ring structure by an alkyl group. Without being bound by theory, it is believed that the sulfonate in combination with the polar groups may interact with the substrate to make the oxidative process more efficient, because the polar substituent in either (both) of those meta- and ortho-positions can provide greater affinity of the oxidizer to the substrate, or can increase the oxidative potential of the compound, or both. Furthermore, multifunctional compounds such as ortho- or meta-polar-functional organosulfonic acids act dually as oxidizing agents and as efficient chelating agents. The ring can be optionally substituted with additional polar groups; however, in some cases too many polar groups can result in undesired and unstable molecules. The parent co-owned pending U.S. patent application Ser. No. 10/690,623 also disclosed that in less preferred embodiments, the organosulfonic acids may include benzenesulfonic acid; benzylsulfonic acid (i.e., α-toluenesulfonic acid); or alkylbenzenesulfonic acids such as toluenesulfonic acid and the like.

While multi-functional aromatic sulfonate compounds having an oxidative function are useful in polishing copper, the most preferred sulfonic acid compound for this invention is benzenesulfonic acid and/or salts thereof. As recited herein and in the claims, unless specifically stated otherwise, the mention of an organosulfonic acid compound includes the acid form and/or a salt form of the organosulfonic compound. Similarly, the sulfonic acid moiety —$SO_3H$ and the sulfonate moiety R—$SO_3^-$ are used interchangeably herein.

Benzenesulfonic acid is present in the fluid composition in a concentration of about 0.1 weight % to about 6 weight % of the total weight of the fluid composition. In a preferred embodiment, the amount of benzenesulfonic acid is between about 0.3 weight % to about 4 weight %, for example between about 0.5 weight % to about 3 weight % of the total weight of the fluid, or alternately between about 0.7 weight percent to about 2.5 weight percent of benzenesulfonic acid.

As recited herein and in the claims, unless specifically stated otherwise, the recitation of percent of a fluid compound means the parts by weight of that compound that would be added to the fluid portion of the composition, wherein the total parts of the fluid composition after the addition is 100 parts. The weight of suspended abrasives is not a factor in this concentration. Alternatively, a component can be given as a weight percent of the slurry or composition, in which case the weight of the suspended abrasive is included in the calculation. Generally, for preferred compositions having less than 6 weight % abrasive, the two methods of reciting concentration result in numerical values that are very close to being the same. Some components may react with other components in a slurry (using as a simple example the conversion of some portion of an organosulfonic acid to an organosulfonate when added to a fluid having a basic pH), but such reaction of various components within the polishing composition after formulation are not pertinent. As recited herein and in the claims, unless specifically stated otherwise, the percent of organo-sulfonic acid compounds are the weight percent of the compound in its acid form.

In some embodiments the polishing composition comprises an organo-sulfonic acid compound having more than one sulfonate moiety attached to a ring structure. The compositions of this invention can optionally comprise one or more of the organosulfonic oxidizers, including especially those disclosed in the parent co-owned pending U.S. patent application Ser. No. 10/690,623, if used in combination with benzenesulfonic acid.

The compositions of the present invention comprise a per-compound oxidizing agent. Suitable per-compound oxidizing agents include, for example, one or more per-compounds, which comprise at least one peroxy group (—O—O—). Suitable per-compounds include, for example, peroxides, hydro-hydrogen peroxides, persulfates (e.g., monopersulfates and dipersulfates), percarbonates, and acids thereof, and salts thereof, and mixtures thereof. Preferred per-compound oxidizing agents include, for example, hydrogen peroxide, hydro-hydrogen peroxide, urea-hydrogen peroxide, sodium peroxide, benzyl peroxide, di-t-butyl peroxide, peracetic acid, percarbonate, monopersulfuric acid, dipersulfuric acid, and salts thereof, and mixtures thereof. Alternatively, the composition can be substantially free of any one or more of urea-hydrogen peroxide, sodium peroxide, benzyl peroxide, di-t-butyl peroxide, peracetic acid, percarbonate, monopersulfuric acid, dipersulfuric acid, periodic acid, and salts thereof, and mixtures thereof. By substantially free of we mean less than 0.2%, preferably less than 0.1% by weight, and most preferably substantially free of the one or more listed oxidizers. The per-compound oxidizing agent in the compositions of this invention is present in the slurry in a concentration of about 0.3 weight % to about 15 weight %, for example between about 0.5 weight % and about 10 weight %, or alternatively between about 1 weight % and about 10 weight %. In one preferred embodiment, the per-compound oxidizing agent is present in a concentration of about 1 weight % to about 5 weight % of the total weight of the slurry. Of course, any combinations of per-type oxidizers can be used. One exemplary combination is hydrogen peroxide and one or more of peracetic acid, percarbonate, and urea-hydrogen peroxide. Another exemplary combination is hydrogen peroxide and a persulfate.

Hydrogen peroxide is a more preferred per-compound oxidizing agent. Advantageously, the polishing compositions of the present invention comprise between about 0.2 weight % and about 10 weight %, for example between about 0.4 weight % and about 6 weight %, of hydrogen peroxide. Preferably the concentration of the hydrogen peroxide is from about 0.5 weight % to about 6 weight %, or alternatively from about 1 weight % to about 5 weight %, of the weight of the fluid composition. Alternatively, the concentration of the hydrogen peroxide is from about 0.5 weight % to about 6 weight %, or from about 1 weight % to about 5 weight %, of the total weight of the polishing slurry.

Advantageously, the pH of the polishing composition is between about 5 and about 11.5, for example between about 5 and 11, and in some embodiments is between about 6 and 11, or alternately between about 7 and about 10.4. Any organic or inorganic acids, bases, or mixture thereof can be used to alter and/or buffer the pH of the polishing composition. While the examples used potassium hydroxide-stabilized silica as an abrasive agent, generally it is advantageous to minimize the metal ions in the fluid composition, for example to less than 100 ppm, preferably less than 50 ppm, for example less than 10 ppm. Metal-free bases, which are generally made with (alkyl) substituted or unsubstituted ammonium hydroxide or hydroxylamine, can be used so long as the ammonia or hydroxylamine does not adversely affect the polishing characteristics of the system.

The process of polishing comprises contacting the substrate to be polished with an abrasive material. Any abrasive material known to be useful in CMP can be used in the process of this invention. It is known that abrasive material can be suspended in a polishing slurry, or can be disposed on a polishing pad, or both. Suitable unmodified abrasives include, but are not limited to, silica, alumina, titania, zirconia, germania, ceria, and co-formed products thereof, and mixtures thereof. Suitable abrasives include, but are not limited to, colloidal products, framed products, and mixtures thereof. The most preferred abrasive is silica, which can be fumed silica, colloidal silica, or any other type of silica abrasive used in the industry, or any mixtures thereof.

Standard (unmodified) abrasives, surface-modified abrasives, or a combination of the two can be employed in this invention. A surface-modified abrasive obtained by treatment of an unmodified abrasive (e.g., silica) with an inorganic or organometallic compound can also be employed in this invention. Suitable inorganic compounds that can be used for surface modification of an abrasive include boric acid, sodium aluminate and potassium aluminate. Suitable organometallic compounds that can be used for surface modification of an abrasive include aluminum acetate, aluminum formate, and aluminum propionate. Combinations of surface-modifying agents can be used on a single abrasive, or abrasives comprising different surface modifications can be used in a polishing system. In a special higher-polishing-rate embodiment of this invention, surface modification may include an iron salt or a copper salt which is absorbed or bound onto the surface of an abrasive, either by itself or in combination with one or more of the other surface-modifying agents.

Some specific examples of surface modified abrasives are modification of silica with boric acid to give boron surface-modified silica and modification of silica with sodium aluminate or potassium aluminate to give aluminate surface-modified silica. Silica and surface-modified silica are a preferred abrasive material used in the present invention. The silica may be, for example, colloidal silica, filmed silica and other silica dispersions; however, the preferred silica is colloidal silica or surface-modified colloidal silica. In a preferred embodiment, colloidal silica can be employed in this invention.

The abrasive, if present in the slurry, can be present in a concentration of about 0.001 weight % to about 30 weight % of the total weight of the slurry (that is, the percentage of the weight of the fluid component plus the weight of the abrasive). In a preferred embodiment, the abrasive is present in a concentration of about 0.05 weight % to about 20 weight % of the total weight of the slurry. In another embodiment, the abrasive is present in a concentration of about 0.1 weight % to about 10 weight % of the total weight of the slurry, for example in a concentration of from about 0.5% to about 5%.

In some preferred embodiments of the invention, the weight % of benzenesulfuric acid is between about 0.5 weight % and about 4 weight %, for example between about 1 weight % and about 3 weight %, and the concentration of the hydrogen peroxide is between about 0.5 weight % and about 7 weight % for example between about 1 weight % and about 5 weight %. Alternatively, the weight % of benzenesulfuric acid is within a factor of about five of the weight percent of the per-type oxidizing compound, for example within a factor of about five of the weight % of hydrogen peroxide.

One advantageous attribute of the compositions of the current invention are the "tunable" and readily predictable polishing rates and selectivities of various materials on the integrated circuit wafer, including copper (or copper alloy) metal, silica (such as PETEOS), barrier layer materials (such as Ti, TiN, Ta, TaN, or combinations thereof), and low-k materials (such as Carbon-doped $SiO_2$, and especially Black Diamond™ brand low-k material). We have found that, for certain preferred embodiments of this invention, that:

1) the TaN/Copper selectivity increases a large amount with increasing oxidizing agent (e.g., hydrogen peroxide) concentration in the fluid composition; the TaN/PETEOS selectivity increases significantly with increasing oxidizing concentration in the fluid composition; the TaN/low-K selectivity increases a small amount with increasing oxidizing agent concentration in the fluid composition; while the Copper/PETEOS selectivity and the Copper/low-k selectivity decrease slightly with increasing oxidizing agent in the fluid composition;

2) the removal rate of the various materials appears to be at a maximum when the concentration of benzenesulfonic acid is near 1%, for example between about 0.5% and 1.5%, and changes in selectivities are modest over a range of 0.5% to 3% benzenesulfonic acid;

3) the TaN/PETEOS selectivity, the TaN/Copper selectivity, Copper/PETEOS selectivity, and the TaN/low-K selectivity each decrease with increasing quantities of abrasive, but the effect decreases as listed (the decrease is most pronounced on the TaN/PETEOS selectivity and is least pronounces on the TaN/low-K selectivity), while the Copper/low-K selectivity is not appreciably affected by variations of the abrasive concentration (between the range of 0.5% to 20% by weight of the slurry);

4) the TaN/Copper selectivity increases a large amount with increasing pH in the fluid composition; the TaN/PETEOS selectivity is substantially unaffected by the pH, while in order of increasing effect the TaN/low-K decreases some, the Copper/PETEOS selectivity decreases a greater amount, and the Copper/low-k selectivity decrease the most with increasing pH; and 5) both Ta and TaN removal rates are substantially increased with increasing benzenesulfonic acid concentration. As described above, selectivity decreases is a decline in the removal rate of the first component relative to the removal rate of the second component, and is not simply a function of how far away from 1 the selectivity may be. These somewhat independent relationships between selectivity and concentration of various components allows a system able to vary each of the benzenesulfonic acid concentration, the oxidizer concentration, the pH, and the abrasive concentration to formulate a composition having almost any desired selectivity characteristics.

Generally, at an intermediate benzenesulfonic acid concentration of 2 weight % and hydrogen peroxide concentrations between about 1% and 5%, for example, the increase in the TaN removal rate and decreases in the copper, carbon-doped $SiO_2$, and PETEOS removal rates are substantially linear with increasing % hydrogen peroxide. Therefore, the selectivity of one component over another, e.g., the TaN/Cu selectivity, the TaN/PETEOS selectivity, the TaN/Black Diamond™ 1 selectivity, and the Cu/PETEOS selectivity are also linear functions of the weight % of hydrogen peroxide. At concentrations nearing 0% hydrogen peroxide, however, the removal rates and selectivities of certain components do not follow the simple linear relationship exhibited when the hydrogen peroxide concentration is between 1 and 5 weight %. While the performance of the polishing composition is still readily predictable for each of the various components even at hydrogen peroxide concentrations less than 1 weight % or less than 0.5 weight %, the slope of the relationship between removal rate and concentration is steep, and minor unintended variations in concentration can have an undesirable effect on the polishing rates. For this reason, preferred embodiments of this invention typically have each component—the per-type oxidizing agent, the benzenesulfonic acid, and even the abrasive—present in an amount greater than 0.5%, for example between 1% and 5%.

Additionally, while historically it was believed to be desirable to have selectivity ratios that were very high, e.g., greater than 20, greater than 40, even greater than 100, we believe a more balance approach is superior. For this reason, advantageously, in one embodiment the preferred compositions of this invention have selectivities, including the TaN/Cu selectivity, the TaN/PETEOS selectivity, the TaN/Black Diamond™ (1) selectivity, the Cu/PETEOS selectivity, the Cu/Black Diamond™ (1) selectivity, and the PETEOS/Black Diamond™ (1) selectivity, which range from about 0.1 to 10. That is, the polishing rates of each material is advantageously within a factor of about 10 of the polishing rates of the other materials. This tune-ability is a very desirable trait. For example, it allows a manufacturer to use a higher selectivity in initial stages of polishing, and then revert to a polishing compound where the silica, copper, barrier materials, and low-k materials are all being polished at about the same rate. By about the same rate we mean selectivities between are about 0.66 and 1.5. See Examples 16, where the Ta/Copper, Ta/PETEOS, Ta/low-k, Copper/PETEOS, Copper/low-k, and PETEOS/low-k selectivities were all about 1, and the TaN/Copper, TaN/PETEOS, and TaN/low-k selectivities were all about 1.5.

Again, one very advantageous attribute of the compositions of the current invention are the readily predictable polishing rates and selectivities of various materials on the integrated circuit wafer, including copper (or copper alloy) metal, silica (such as PETEOS), barrier layer materials (such as Ti, TiN, Ta, TaN, or combinations thereof), and low-k materials (such as Carbon-doped $SiO_2$, and especially Black Diamond™ brand low-k material). Generally, for compositions having a balanced amount of oxidizing agent plus benzenesulfonic acid, the removal rate of PETEOS increases linearly with increasing abrasive concentration. The removal rate of low-K carbon-doped silica also increases linearly with increasing abrasive concentration, at a rate similar to or slightly greater than the rate than the increases seen for PETEOS, The removal rate of copper also increases linearly with increasing abrasive concentration, but at a lower rate than the increases seen for PETEOS. Finally, the removal rate of barrier material, such as tantalum nitride, only increases at a rate proportional to about the square root of the silica concentration. Therefore, general changes in the copper/TaN selectivity, the PETEOS/TaN selectivity, and the low-K/TaN selectivity can be achieved by varying the abrasive concentration.

Other chemicals that may be added to the CMP slurry composition include, for example, water-miscible solvents, surfactants, pH adjusting agents, acids, corrosion inhibitors, fluorine-containing compounds, chelating agents, non-polymeric nitrogen-containing compounds, and salts. It is envisioned that in certain preferred embodiments of the invention, the polishing compositions are substantially free of water-miscible solvents, surfactants, pH adjusting agents, acids, corrosion inhibitors, fluorine-containing compounds, chelating agents, non-polymeric nitrogen-containing compounds, salts, and any combinations of the foregoing chemicals/additives. By substantially free it is meant the compound, chemical, and/or additive may be present in an amount that does not materially affect the polishing characteristics—material polishing rates, selectivities, and contamination of substrates. This can be as little as "less than 0.01 weight %" for fluoride-containing additives to "less than 0.1 weight %" for corrosion inhibitors. The phrase "substantially free of" advantageously and preferably encompasses compositions that are totally free of the compound, chemical, and/or additive.

Suitable water-miscible solvents that may be added to the slurry composition include, for example, ethyl acetate, methanol, ethanol, propanol, isopropanol, butanol, glycerol, ethylene glycol, and propylene glycol, and mixtures thereof. The water-miscible solvents, if present in the slurry composition, may be present in a concentration of about 0.01% weight % to about 6 weight % in one embodiment, alternatively from about 0.01 weight % to about 4 weight %, or about 0.1 weight % to about 2 weight % in another embodiment, and, in a concentration of about 0.5 weight % to about 1 weight % in yet another embodiment; each of these weight % values is based on the total weight of the fluid composition, or alternately can be based on the total weight of the slurry. The preferred types of water-miscible solvents are isopropanol, butanol, and glycerol.

Suitable surfactant compounds that may be added to the slurry composition include, for example, any one or more of the numerous nonionic, anionic, cationic or amphoteric surfactants known to those skilled in the art. The surfactant compounds, if present in the slurry composition, may be present in a concentration of about 0.0001 weight % to about 1.5 weight % in one embodiment, or about 0.0005 weight % to about 1 weight % in another embodiment, and, in a concentration of about 0.001 weight % to about 0.5 weight % in yet another embodiment; each of these weight % values is based on the total weight of the slurry. The preferred types of surfactants are nonionic, anionic, or mixtures thereof and are most preferably present in a concentration of about 10 ppm to about 1000 ppm of the total weight of the slurry. Nonionic surfactants are most preferred.

The pH-adjusting agent is used to improve the stability of the polishing composition, to improve the safety in use or to meet the requirements of various regulations. As a pH-adjusting agent to be used to lower the pH of the polishing composition of the present invention, hydrochloric acid, nitric acid, sulfuric acid, chloroacetic acid, tartaric acid, succinic acid, citric acid, malic acid, malonic acid, various fatty acids, various polycarboxylic acids may be employed. On the other hand, as a pH-adjusting agent to be used for the purpose of raising the pH, potassium hydroxide, sodium hydroxide, ammonia (ammonium hydroxide), tetramethylammonium hydroxide, ethylenediamine, piperazine, polyethyleneimine, etc., may be employed. The polishing composition of the present invention is not particularly limited with respect to the pH, but it is usually adjusted to pH 5 to 11. In one embodiment, a suitable slurry pH is from about 5 to about 11. In another embodiment, a suitable slurry pH is from about 6 to about 10. While useful polishing compositions of the present invention can be formulated with pH values of about 4 to 5, generally a more neutral solution is preferred. And while useful polishing compositions of the present invention can be formulated with pH values of about 11 to 12, such strong bases can require added safety precautions and special handling, and are not preferred.

Other suitable acid compounds that may be added (in place of or in addition to the pH-adjusting acids mentioned supra) to the slurry composition include, but are not limited to, formic acid, acetic acid, propanoic acid, butanoic acid, pentanoic acid, hexanoic acid, heptanoic acid, octanoic acid, nonanoic acid, lactic acid, hydrochloric acid, nitric acid, phosphoric acid, sulfuric acid, hydrofluoric acid, malic acid, tartaric acid, gluconic acid, citric acid, phthalic acid, pyrocatechoic acid, pyrogallol carboxylic acid, gallic acid, tannic acid, and mixtures thereof. In one embodiment, ascorbic acid can be included in the composition. These acid compounds may be present in the slurry composition in a concentration of about 0 weight % to about 5 weight %, for example between about 0.05 weight % to about 1.5 weight %, of the total weight of the fluid composition.

Suitable corrosion inhibitors that may be added to the slurry composition include, for example, 1,2,4-triazole, benzotriazole, 6-tolylytriazole, tolyltriazole derivatives, 1-(2,3-dicarboxypropyl)benzotriazole, branched-alkylphenol-substituted-benzotriazole compounds, TINUVIN® 99-2, TINUVIN® 109, TINUVIN® 213, TINUVIN® 234, TINUVIN® 326, TINUVIN® 328, TINUVIN® 329, TINUVIN® 384-2, N-acyl-N-hydrocarbonoxyalkyl aspartic acid compounds, and mixtures thereof. The corrosion inhibitor may be present in the slurry in a concentration of about 1 ppm to about 7000 ppm in an embodiment, more typically from 1 to about 5000 ppm, or alternatively from about 10 ppm to about 4000 ppm in another embodiment, and from about 50 ppm to about 2000 ppm in yet another embodiment, all based on the total weight of the fluid composition. Preferred corrosion inhibitors are 1,2,4-triazole, TINUVIN® 109, TINUVIN® 328, TINUVIN® 329, CDX2128 and CDX2165. CDX2128 and CDX2165 are supplied by King Industries, and are preferably present in a concentration of about 1 ppm to about 1000 ppm of the total weight of the slurry. TINUVIN® 109, TINUVIN® 328, and TINUVIN® 329 are supplied by Ciba Specialty Chemicals Corporation, and are preferably present in a concentration of about 1 ppm to about 500 ppm of the total weight of the slurry.

Carboxylic acids, if added, may also impart corrosion inhibition properties to the slurry composition.

To increase further the selectivity of tantalum and tantalum compounds relative to silicon dioxide, fluorine-containing compounds may be added to the slurry composition. Suitable fluorine-containing compounds include, for example, hydrogen fluoride, perfluoric acid, alkali metal fluoride salt, alkaline earth metal fluoride salt, ammonium fluoride, tetramethylammonium fluoride, ammonium bifluoride, ethylenediammonium difluoride, diethylenetriammonium trifluoride, and mixtures thereof. The fluorine-containing compounds may be present in the slurry composition in a concentration of about 0 weight % to about 5 weight % in an embodiment, preferably from about 0.65 weight % to about 5 weight % in another embodiment, from about 0.5 weight % to about 2 weight % in yet another embodiment, all based on the total weight of the fluid composition. If fluorine-containing compound are contained in the slurry, the quantity may be such that there is between about 0.005 weight % to about 1 weight % of fluoride provided by the fluorine-containing compounds. A suitable fluorine-containing compound is ammonium fluoride.

Suitable chelating agents that may be added to the slurry composition include any chelators known in the art. Exemplary chelators include, but are not limited to, ethylenediaminetetracetic acid, N-hydroxyethylethylenediaminetriacetic acid, nitrilotriacetic acid, diethylenetriaminepentacetic acid, ethanoldiglycinate, glycine, tricine, citric acid, 2,3-butanedione dioxime (dimethylglyoxime) and mixtures thereof. The chelating agents may be present in the slurry composition in a concentration of 0.01 weight % to about 5 weight % in one embodiment, alternatively about 0.01 weight % to about 4 weight % in another embodiment, and in a concentration of about 0.1 weight % to about 2 weight % in another embodiment based on the total weight of the fluid composition. Preferred chelating agents are glycine, tricine, citric acid, 2,3-butanedione dioxime and ethylenediaminetetracetic acid. When present, a chelating agent is usually present in a concentration of about 0.1 weight % to about 2 weight % of the total weight of the slurry.

Suitable non-polymeric nitrogen-containing compounds (amines, hydroxides, etc.) that may be added to the slurry composition include, for example, ammonium hydroxide, monoethanolamine, diethanolamine, triethanolamine, diethyleneglycolamine, N-hydroxylethylpiperazine, and mixtures thereof. The non-polymeric nitrogen-containing compound can advantageously be used to raise the pH, and may comprise a C1-C3 partially or fully alkyl-substituted ammonium hydroxide. The non-polymeric nitrogen-containing compound may comprise a partially or fully substituted ammonium hydroxide, where one or more of the hydrogens is substituted with a moiety independently selected from C1-C3 alkyl moieties and C1-C3 alkoxy moieties, said formula including choline. These non-polymeric nitrogen-containing compounds may be present in the slurry composition in a concentration of about 0 weight % to about 1 weight %, and, if present, are normally present at a level of about 0.01 weight % to about 0.2 weight % of the total weight of the slurry. A preferred non-polymeric nitrogen-containing compound is ammonium hydroxide and is most preferably present in a concentration of about 0.01 weight % to about 0.1 weight % of the total weight of the fluid composition.

In an alternate embodiment the fluid composition may comprise hydroxylamine or a hydroxylamine having one or more hydrogens independently substituted with C1-C3 alkyl moiety, in an amount the same as stated for the non-polymeric nitrogen-containing compounds. The composition may additionally or alternately include a mineral acid salt of hydroxylamine, e.g., hydroxylamine sulfate, hydroxylamine nitrate, hydroxylamine phosphate, or the like, a carboxylic acid of hydroxylamine, or any combinations thereof.

to apply a downward pressure against the backside of the substrate during CMP processing while the platen and the substrate are rotated. The polishing composition (slurry) is applied (usually continuously) on the pad during CMP processing to effect the removal of material to planarize the substrate. Since the associated methods of this invention employ the compositions described herein, the ranges (e.g., pH, component levels) described for composition embodiments also apply to corresponding method embodiments.

The composition and associated methods of this invention are effective for CMP of a wide variety of substrates, including substrates having dielectric portions that comprise materials having dielectric constants less than 3.3 (low-k materials). Suitable low-k films in substrates include, but are not limited to, organic polymers, carbon-doped oxides, fluorinated silicon glass (FSG), inorganic porous oxide-like materials, and hybrid organic-inorganic materials. Representative low-k materials and deposition methods for these materials are summarized below.

| Vendor | Trade Name | Deposition Method | Material |
|---|---|---|---|
| Air Products and Chemicals | MesoElk ® | Spin-on | Hybrid organic-inorganic |
| Applied Materials | Black Diamond ® | CVD | Carbon-doped oxide |
| Dow Chemical | SiLK ™, Porous SiLK ™ | Spin-on | Organic polymer |
| Honeywell Electronic Materials | NANOGLASS ® E | Spin-on | Inorganic oxide-like |
| Novellus Systems | CORAL ® | PECVD | Carbon-doped oxide |

PECVD = Plasma enhanced chemical vapor deposition
CVD = chemical vapor deposition Suitable salts that optionally may be added to the slurry composition include, for example, ammonium persulfate, potassium persulfate, potassium sulfite, potassium carbonate, ammonium nitrate, potassium hydrogen phthalate, hydroxylamine sulfate, and mixtures thereof. The salts may be present in the slurry composition in a concentration of about 0 weight % to about 10 weight %, and, if present, are normally present at a level of about 0.02 weight % to about 5 weight %, for example between about 0.04% to about 1%, of the total weight of the fluid composition, or alternatively based on the total weight of the slurry.

Still other chemicals that can be added to the slurry compositions are biological agents such as bactericides, biocides and fungicides. It is preferred to have one or more of these biological agents if the pH is around about 6 to 9. Suitable biocides, include, but are not limited to, 1,2-benzisothiazolin-3-one; 2(hydroxymethyl)amino ethanol; 1,3-dihydroxymethyl-5,5-dimethylhydantoin; 1-hydroxymethyl-5,5-dimethylhydantion; 3-iodo-2-propynyl-butylcarbamate; glutaraldehyde; 1,2-dibromo-2,4-dicyanobutane; 5-chloro-2-methyl-4-isothiazoline-3-one; 2-methyl-4-isothiazolin-3-one; and mixtures thereof. Preferred biocides are isothiazolines and benzisothiazolines. When present, a biocide is usually present in a concentration of about 0.001 weight % to about 0.1 weight % of the total weight of the slurry.

Associated Methods

The associated methods of this invention entail use of the aforementioned fluid composition or slurry (as disclosed supra) for chemical mechanical planarization of substrates comprised of metals, barrier layer materials, and dielectric materials. In the methods, a substrate (e.g., a wafer) is typically placed face-down on a polishing pad which is fixedly attached to a rotatable platen of a CMP polisher. In this manner, the substrate to be polished and planarized is placed in direct contact with the polishing pad. A wafer carrier system or polishing head is used to hold the substrate in place and Similarly, the composition and associated methods of this invention are effective for CMP of substrates comprised of various metals, including, but not limited to, tantalum, titanium, tungsten, copper, noble metals, and alloys thereof. The composition and associated methods of this invention are particularly useful and preferred in copper CMP processing (e.g., step 2 copper CMP), and afford tune-ability for the selective removal of barrier layer materials, copper, low-k dielectric layer materials, and PETEOS dielectric layer materials; and high removal rates for barrier layer material (e.g., tantalum nitride and tantalum) and low-k dielectric layer materials (e.g., Black Diamond®) in relation to PETEOS dielectric materials and copper (as illustrated in the examples). A combination of (i) abrasive concentration, and (ii) the synergistic combination of hydrogen peroxide concentration with benzenesulfonic acid concentration, offers considerable flexibility and provides tunability for the selective removal of barrier layer materials, copper, low-k dielectric materials, and PETEOS dielectric layer materials, during CMP processing by varying the pH, the downward pressure and/or rotational velocity, the polishing slurry supply rate, the concentration of abrasive, the concentration of per-type compounds, preferably hydrogen peroxide, and the concentration of benzenesulfonic acid.

While not being bound by any particular theory, the inventor(s) believes that the following considerations may explain why a polishing composition comprising a) an abrasive, b) benzenesulfonic acid, c) a per-compound oxidizing agent, and d) water exhibits enhanced barrier layer material and low-k dielectric material removal rates in CMP processing. Typically when a slurry composition is exposed to copper and tantalum and/or tantalum nitride with a commonly used oxidizer such as hydrogen peroxide under basic conditions during CMP processing, both copper and tantalum and/or tantalum nitride undergo corrosion to form copper and tantalum ions, which forms passive hard copper oxide and tantalum oxide films. This phenomena is well understood, and the conditions under which such reactions occur is known from Pourbaix diagrams of copper (pages 385-392) and tantalum (pages 251-255) in Atlas of Electrochemical Equilibria in Aqueous Solutions, by M. J. N. Pourbaix, published by National Association of Corrosion Engineers, Houston, Tex. (1974). Thus, in an aqueous composition using hydrogen peroxide at a basic pH, copper and tantalum removal rates are very low. As described in the invention, the addition of benzenesulfonic acid to a slurry is believed to result in complexation with tantalum ions under basic pH polishing conditions. This complexation assists in maintaining tantalum ions in solution as benzenesulfonic acid complexes with tantalum ions, resulting in high tantalum and/or tantalum nitride removal. Interestingly, in the presence of both hydrogen peroxide and benzenesulfonic acid, copper removal rates are typically much lower than tantalum and/or tantalum nitride. This is possibly due to a much higher passivation rate for copper than tantalum and/or tantalum nitride in a mixture of hydrogen peroxide and benzenesulfonic acid. Compared to hydrogen peroxide, benzenesulfonic acid not only serves as oxidants but complexes with tantalum ions to form tantalum sulfonate complexes, which results in high tantalum and/or tantalum nitride removal rates. Interestingly, the inventive slurry also facilitates high removal rates of carbon-doped oxides, for example Black Diamond® low-k dielectric material.

The present invention is further demonstrated, but is not intended to be limited, by the examples below. The COMPONENTS used in the Examples include:

A) Benzenesulfonic acid: Aldrich Chemical Company, Inc, 1001 West St. Paul, Milwaukee, Wis. 53233.

B) Hydrogen Peroxide: a 30 weight % solution, Air Products and Chemicals, Inc., 7201 Hamilton Blvd. Allentown, Pa. 18195-1501.

C) Potassium Hydroxide: Aldrich Chemical Company, Inc, 1001 West St. Paul, Milwaukee, Wis. 53233.

D) Potassium-stabilized colloidal silica: DuPont Air Products NanoMaterials L.L.C., 2507 West Erie Drive, Tempe, Ariz. 85282 (an approximately 30 weight % potassium-stabilized dispersion in water with a particle size of 50-60 nanometers as measured by Capillary Hydro-Dynamic Flow using a Matec Applied Sciences model number CHDF 2000 instrument.)

C) The SUBSTRATES used in the Examples include:

Black Diamond® Applied Producer® Black Diamond® chemical vapor deposition (CVD) film, a low k dielectric layer.

PETEOS Plasma enhanced deposition of tetraethoxy silane; a dielectric oxide layer.

Blanket wafers are those that have typically one type of surface prepared for polishing experiments. Generally, unless otherwise specified, polishing rates (typically in Å/min, where Å is the unit of length angstroms and min is minute) and selectivities are the rates and selectivities of the various materials (copper, PETEOS, Ta, TaN, and Black Diamond®, are the rates observed when polishing blanket wafers comprising the various materials under the same conditions, that is, under the same pressure (psi: pounds per square inch); rotational velocity (rpm: revolutions per minute), temperature, and fluid and abrasive concentration, and fluid and abrasive supply (ml/min: milliliters/minute).

To be economically useful, advantageously the CMP (chemical mechanical planarization, or chemical mechanical polishing) rate of at least the target components or materials is 60 Å/min or greater. Selectivities are unitless, and are written herein as for example TaN:BD1 Sel or TaN lack Diamond® Sel, where:

TaN:BD1 Sel Tantalum nitride:Black Diamond® Selectivity—the ratio of the amount of tantalum nitride removed to the amount of Black Diamond® removed during CMP experiments using blanket wafers under identical conditions.

TaN:Cu Sel Tantalum nitride:Copper Selectivity—the ratio of the amount of tantalum nitride removed to the amount of copper removed during CMP experiments using blanket wafers under identical conditions.

TaN:PETEOS Sel Tantalum nitride:PETEOS Selectivity—the ratio of the amount of tantalum nitride removed to the amount of PETEOS removed during CMP experiments using blanket wafers under identical conditions.

Cu:BD1 Sel Copper:Black Diamond® Selectivity—the ratio of the amount of copper removed to the amount of Black Diamond® removed during CMP experiments using blanket wafers under identical conditions.

Cu:PETEOS Sel Copper:PETEOS Selectivity—The ratio of the amount of copper removed to the amount of PETEOS (dielectric material) removed during CMP experiments using blanket wafers under identical conditions.

EXAMPLES

All percentages are weight percentages and all temperatures are degrees Celsius unless otherwise indicated. Unless otherwise described, in the examples presented below, CMP experiments were run using the procedures and experimental conditions given below.

Metrology—PETEOS and Black Diamond® thickness was measured with a Nanometrics, model, #9200, manufactured by Nanometrics Inc, 1550 Buckeye, Milpitas, Calif. 95035. The metal films were measured with a ResMap CDE, model 168, manufactured by Creative Design Engineering, Inc, 20565 Alves Dr, Cupertino, Calif., 95014. This tool is a four-point probe sheet resistance tool. Twenty-five and forty nine-point polar scans were taken with the respective tools at 3-mm edge exclusion.

The CMP tool that was used is a Mirra®, manufactured by Applied Materials, 3050 Boweres Avenue, Santa Clara, Calif., 95054. A Politex® embossed pad, supplied by Rohm and Haas Electronic Materials, 3804 East Watkins Street, Phoenix, Ariz., 85034, was used on the platen for the blanket wafer polishing studies. In blanket wafers studies, polish time was 60 seconds per wafer. The Mirra® tool mid-point conditions for polishing blanket wafers were: platen (or table) speed 90 rpm; head speed 84 rpm; retaining ring pressure 3.0 psi; inter-tube pressure 3.0 psi; membrane pressure 2.0 psi; slurry flow 200 ml/min.

Blanket wafer polishing experiments were conducted using Black Diamond® PETEOS, CVD tantalum nitride, and electrochemically deposited copper wafers. The Black Diamond® wafers were purchased from Advanced Technology Development Facility (ATDF), 2706 Montopolis Drive, Austin, Tex. 78741. The Cu, PETEOS, tantalum and tantalum nitride blanket wafers were purchased from Silicon Valley Microelectronics, 1150 Campbell Ave, Calif. 95126. The nominal blanket wafer film thickness and specifications are summarized below:

Black Diamond®: 10,000 Å on silicon

Copper: 10,000 Å electroplated copper/1,000 Å copper seed/250 Å tantalum on silicon PETEOS: 15,000 Å on silicon Tantalum nitride: 3000 Å on 3,000 Å thermal oxide (on silicon)

Tantalum: 3,000 Å on 3,000 Å thermal oxide (on silicon).

Examples 1-23

For comparative Examples 1-4 and Examples 5-23, CMP slurry compositions as shown in Tables 1-a and Tables 1-b, 2, 3, 4, and 5 were prepared and tested using the methodology, equipment, and processing as described supra. The weight % levels of benzenesulfonic acid, weight % levels of hydrogen peroxide, and weight % level of abrasive were varied as indicated below (and in Tables 1-5).

In comparative examples, one or more key ingredients are not present:

Comparative Example 1-Table 1: 3 weight % potassium-stabilized colloidal silica, 1 weight % hydrogen peroxide, no benzenesulfonic acid, pH 11.2

Comparative Example 2-Table 1: 3 weight % potassium-stabilized colloidal silica, 5 weight % hydrogen peroxide, no benzenesulfonic acid, and pH adjusted to 8.5

Comparative Example 3-Table 1: 3 weight % potassium-stabilized colloidal silica, 7.5 weight % hydrogen peroxide, no benzenesulfonic acid, pH 9.6

Comparative Example 4-Table 1: 3 weight % potassium-stabilized colloidal silica, no hydrogen peroxide, 2 weight % benzenesulfonic acid, pH 10.2

In Examples 5-7, the pH and the amount of hydrogen peroxide was varied.

Example 5-Table 1: 3 weight % potassium-stabilized colloidal silica, 1 weight % hydrogen peroxide, 2 weight % benzenesulfonic acid, pH 9.5

Example 6-Table 1: 3 weight % potassium-stabilized colloidal silica, 2.5 weight % hydrogen peroxide, 2 weight % benzenesulfonic acid, pH 9.1

Example 7-Table 1 and Table 2: 3 weight % potassium-stabilized colloidal silica, 5 weight % hydrogen peroxide, 2 weight % benzenesulfonic acid, pH 8.5

In Examples 7-10, the amount of benzenesulfonic acid was varied.

Example 8-Table 2: 3 weight % potassium-stabilized colloidal silica, 5 weight % hydrogen peroxide, 0.5 weight % benzenesulfonic acid, pH 8.7

Example 9-Table 2: 3 weight % potassium-stabilized colloidal silica, 5 weight % hydrogen peroxide, 1 weight % benzenesulfonic acid, pH 8.6

Example 10-Table 2: 3 weight % potassium-stabilized colloidal silica, 5 weight % hydrogen peroxide, 3 weight % benzenesulfonic acid, pH 8.6

In Examples 11-14, the amount of abrasive and the pH were varied.

Example 11-Table 3: 0.5 weight % potassium-stabilized colloidal silica, 1 weight % hydrogen peroxide, 1 weight % benzenesulfonic acid, pH 9.2

Example 12-Table 3: 1.5 weight % potassium-stabilized colloidal silica, 1 weight % hydrogen peroxide, 1 weight % benzenesulfonic acid, pH 9.8

Example 13-Table 3: 10 weight % potassium-stabilized colloidal silica, 1 weight % hydrogen peroxide, 1 weight % benzenesulfonic acid, pH 9.8

Example 14-Table 3: 20 weight % potassium-stabilized colloidal silica, 1 weight % hydrogen peroxide, 1 weight % benzenesulfonic acid, pH 10.0

In Examples 15-19, the pH was varied.

Example 15-Table 4: 10 weight % potassium-stabilized colloidal silica, 1 weight % hydrogen peroxide, 1 weight % benzenesulfonic acid, pH 6.2

Example 16-Table 4: 10 weight % potassium-stabilized colloidal silica, 1 weight % hydrogen peroxide, 1.0 weight % benzenesulfonic acid, pH 7.1

Example 17-Table 4: 10 weight % potassium-stabilized colloidal silica, 1 weight % hydrogen peroxide, 1 weight % benzenesulfonic acid, pH 8.7

Example 18-Table 4: 10 weight % potassium-stabilized colloidal silica, 1 weight % hydrogen peroxide, 1 weight % benzenesulfonic acid, pH 9.4

Example 19-Table 4: 10 weight % potassium-stabilized colloidal silica, 1 weight % hydrogen peroxide, 1 weight % benzenesulfonic acid, pH 9.9

In Examples 20-7, the amount of abrasive was kept to a minimum and the amount of benzenesulfonic acid was varied to show the effect of varying the benzenesulfonic acid.

Example 20-Table 5: 0.1 weight % potassium-stabilized colloidal silica, 1 weight % hydrogen peroxide, 0.5 weight % benzenesulfonic acid, pH 9.1

Example 21-Table 5: 0.1 weight % potassium-stabilized colloidal silica, 1 weight % hydrogen peroxide, 1 weight % benzenesulfonic acid, pH 9.1

Example 22-Table 5: 0.1 weight % potassium-stabilized colloidal silica, 1 weight % hydrogen peroxide, 1.5 weight % benzenesulfonic acid, pH 9.1

Example 23-Table 5; 0.1 weight % potassium-stabilized colloidal silica, 1 weight % hydrogen peroxide, 2 weight % benzenesulfonic acid, pH 9.1

Comparative Example 1

Procedure for Mixing the Polishing Slurry, 1.5 kg Batch Size—A polishing slurry was prepared comprising 1 weight % hydrogen peroxide with no benzenesulfonic acid; as described below and in Table 1. In a 3 liter beaker, 1099.6 g of deionized water were transferred, and maintained under agitation using a magnetic stirrer. Under agitation, 150 g of potassium-stabilized colloidal silica (30 weight % sol) was added over a period of 2 minutes. After completing the addition of silica, 0.82 g of potassium hydroxide (45 weight % solution) was added under agitation and mixed for an additional 5 minutes. To the formulated slurry, 50 g of hydrogen peroxide (30 weight % solution) was added prior to polishing blanket copper, tantalum nitride, Black Diamond®, and PETEOS wafers using a Mirra® CMP tool. The polishing slurry pH after addition of hydrogen peroxide was 11.2.

Polishing Slurry Mixing Procedure for Comparative Examples 2-4 and Examples 5-23

For examples 2-23, a procedure similar to Example 1 was used with minor variations; the polishing slurry compositions of Examples 2-23 are tabulated in Tables 1, 2, 3, 4 and 5. In each case, the balance of the composition was deionized water. Final pH adjustment was done using potassium hydroxide as indicated in Tables 1, 2, 3, 4 and 5.

Polishing Experiments for Comparative Examples 1-4 and Examples 5-23

In Examples 1-23, CMP slurry compositions as shown in Tables 1, 2, 3, 4 and 5 were prepared and tested using the methodology, equipment, and processing as described supra. The Example 1-23 compositions were used to polish copper, PETEOS, Black Diamonds and tantalum nitride blanket wafers. The Example 15-23 compositions were used to also polish copper tantalum blanket wafers. The results of the polishing experiments such as copper removal rate at 2.0 psi membrane pressure, PETEOS removal rate at 2.0 psi membrane pressure, Black Diamond® removal rate at 2.0 psi membrane pressure, tantalum nitride removal rate at 2.0 psi membrane pressure, TaN:BD1 Sel at 2.0 psi membrane pressure, TaN:Cu Sel at 2.0 psi membrane pressure, TaN:PETEOS Sel at 2.0 psi membrane pressure, Cu:BD1 Sel at 2.0 psi membrane pressure, and Cu:PETEOS Sel at 2.0 psi membrane pressure are summarized in Tables 1, 2, 3, 4 and 5. Tantalum removal rate at 2.0 psi membrane pressure are summarized in Tables 4 and 5. As illustrated in Tables 1-5, the results clearly demonstrate advantages of using benzenesulfonic acid and hydrogen peroxide in slurry compositions from the standpoint of tantalum and/or tantalum nitride and Black Diamond® removal rates. Also the results demonstrate a synergy between benzenesulfonic acid and hydrogen peroxide when used together in slurry formulations.

Table 1-a includes Comparative Examples 1, 2, and 3 using 1 weight %, 5 weight % and 7.5 weight % hydrogen peroxide, without benzenesulfonic acid, and all containing 3 weight % potassium stabilized silica. Clearly, the data for Comparative Examples 1, 2, and 3 suggest that as the concentration of hydrogen peroxide increased, PETEOS removal rates were unchanged and stayed about zero at 3 weight % abrasive concentration, whereas some variations were observed in copper and Black Diamond® removal rates. At 1 weight % hydrogen peroxide and high concentrations (7.5 weight %) of hydrogen peroxide, low tantalum nitride removal rates were observed, for instance tantalum nitride removal rates were: 222 Å/min at 1 weight % hydrogen peroxide, decreased to 128 Å/min at 5 weight % hydrogen peroxide, with slight increase to 179 Å/min at 7.5 weight % hydrogen peroxide. In Table 1-a, Comparative Example 4 contains 2 weight % benzenesulfonic acid with no hydrogen peroxide. Compared to Examples 1, 2, and 3 with hydrogen peroxide only, 2 weight % benzenesulfonic acid with no hydrogen peroxide gave a two-fold higher copper removal rate, a two-fold to three-fold higher Black Diamond® removal rate, an eight-fold higher PETEOS rate, and a 1.3-fold higher tantalum nitride removal rate, e.g., at 5 weight % hydrogen peroxide tantalum removal rates were 179 Å/min versus 289 Å/min using 2 weight % benzenesulfonic acid.

In Table 1-b, Examples 5, 6, and 7 show how an increase in the concentration of hydrogen peroxide from 1 weight % hydrogen peroxide, 2 weight % hydrogen peroxide, and 5 weight % hydrogen peroxide with fixed amount of 2 weight % benzenesulfonic acid gives a synergy in increasing tantalum nitride removal rates from 289 Å/min to 520 Å/min, 558 Å/min, and 604 Å/min at 5 weight % hydrogen peroxide. The slope of the line (and the "zero" hydrogen peroxide datum supplied by the Comparative examples) suggests the removal rate and especially the selectivity results can be extrapolated beyond the limits of 1-5 weight % hydrogen peroxide, to say between about 0.1 weight % to about 8 weight %, and perhaps even further. Interestingly, tantalum nitride removal rates decreased as the concentration of hydrogen peroxide increased in the absence of benzenesulfonic acid. Interestingly, removal rates of Black Diamond®, PETEOS, and copper decreased. Thus, a mixture of hydrogen peroxide and benzenesulfonic acid in the narrow concentration range offers unique tune-ability for tantalum nitride to copper, tantalum nitride to PETEOS, and tantalum nitride to Black Diamond® by selective ratio of hydrogen peroxide to benzenesulfonic acid.

In Table 2, Examples 7, 8, 9, and 10 show the effect of changing the concentration of benzenesulfonic acid between 0.5 weight %, 1 weight %, 2 weight %, to 3 weight % at a fixed 5 weight % concentration of hydrogen peroxide. There may be some systematic error, as removal rates of Black Diamond®, TaN, PETEOS, and copper all increase to a maximum at 1 weight % benzenesulfonic acid. Alternatively, there may be another competing variable which is affecting data. One variable which may be pertinent is the ratio of benzenesulfonic acid to hydrogen peroxide in the fluid composition. The presence of another variable, or the presence of any systematic error, is merely speculation. As the data show, as the concentration of benzenesulfonic acid increased from 0.5 weight % to 1 weight %, removal rate of tantalum nitride increased from 353 Å/min to 675 Å/min; additional increase in the concentration of benzenesulfonic acid from 1.0 weight % to 2 weight % decreased tantalum nitride removal rate from 675 Å/min to 604 Å/min, dramatically dropped again to 504 Å/min at 3 weight % benzenesulfonic acid. Interestingly, Black Diamond®, PETEOS, and copper in Example 7, 8, 9, and 10 behaved very much like tantalum nitride, first removal rates increased, the followed by a decrease in the removal rates. Again this data point to unique combination of hydrogen peroxide and benzenesulfonic acid and specific ratio of the two additives in maximizing or minimizing the removal rates and tunability of tantalum nitride to copper, tantalum nitride to PETEOS, and tantalum nitride to Black Diamond®.

In Table 3, Examples, 11, 12, 13, and 14 show the effect of abrasive concentration at 1 weight % hydrogen peroxide, and 1 weight % benzenesulfonic acid. Clearly data suggest that as the abrasive concentration increased from 0.5 weight % to 20 weight %, removal rates of PETEOS increased dramatically from 64 Å/min to 1003 Å/min, whereas removal rates of Black Diamond® also increased dramatically from 190 Å/min to 1269 Å/min. Unlike PETEOS, and Black Diamond®, removal rates of copper increased gradually from 64 Å/min to 384 Å/min, and tantalum nitride removal rates also increased gradually from 187 Å/min to 508 Å/min.

The increase in PETEOS removal rate followed a linear relationship, where the PETEOS Removal Rate ("RR") in angstroms/minute was about 50*(% silica), where "*" is "multiplied by." The increase in Black Diamond® RR in angstroms/minute could be estimated as 160+60*(% silica). Even copper RR followed a linear relationship, that is, Copper RR in angstroms/minute could be estimated as 60+16*(% silica). Note that while the effect of the abrasive (silica) concentration on copper RR was linear, the slope of the line was a factor of three or four less than the slope of RR versus (% silica) observed for PETEOS and for Black Diamond®, respectively. Nevertheless, very little change in any selectivity not incorporating TaN can be obtained by varying the amount of abrasive. The increase in the TaN RR rate was not linear with (% silica), suggesting abrasion is not a dominant factor in the removal of TaN. The difference allows an excellent means to tune TaN selectivity versus PETEOS, Black Diamond®, and copper.

The above mathematical relationships were matched to a system using 50 to 60 nanometer colloidal silica. Generally, the median weight average particle size for abrasives suspended in the fluid composition can range from about 7 nanometers to about 400 nanometers, but the median weight average particle size is preferably between about 20 nanometers in diameter and about 200 nanometers in diameter, say for example between about 35 nanometers to about 100 nanometers in diameter. Use of harder abrasives, e.g., fumed silica or alumina, can require lower concentrations of abrasives, though more substrate scratching will result. Similarly, utilizing larger abrasives, alone or along with the 50-60 nanometer silica described in the examples, can reduce the amount of abrasive required to achieve a desired removal rate, but again there may be added defects in the polished product.

In Table 4, Examples 15, 16, 17, 18, and 19 show the effect of pH on the removal rates of copper, tantalum nitride, tantalum, PETEOS, and Black Diamond®. At neutral pH (Example 16), the removal rates of copper, PETEOS, and Black Diamond® and tantalum are at an almost 1:1:1:1 selectivity whereas tantalum nitride is not very sensitive to pH changes from the standpoint of removal rates. As the pH increased from 7 to 10, removal rates of Black Diamond® increased dramatically whereas removal rates of copper decreased due to increased passivation of copper at high pH. Interestingly, as the pH increased from 7 to 10 removal rates of PETEOS and tantalum first decreased followed by slight increase in the removal rates.

The pH dependence data suggest how 1 weight % ratio of hydrogen peroxide, and 1 weight % benzenesulfonic acid and 3 weight % abrasive at pH 7 produces exactly 1:1:1:1 selective slurry with respect to PETEOS, Black Diamond®, tantalum, and copper. Very close to uniform selectivity (a selectivity of 1) between the various components can be achieved if the concentration of hydrogen peroxide is between 0.5 weight % to 1.5 weight %, for example 0.75 weight % to 1.25 weight % based on weight of the fluid composition; the concentration of benzenesulfonic acid is between 0.5 weight % to 1.5 weight %, for example 0.75 weight % to 1.25 weight % based on weight of the fluid composition; and an abrasive concentration of about 2 weight % to about 12 weight %; while maintaining a pH between about 6 and 8, for example between about 6.5 and about 7.5. Such a polishing composition is highly desirable for the final polishing of wafers. Generally, the hydrogen peroxide can be replaced with other per-type oxidizers, so long as the concentration of oxidizer provides the same molar concentration of per-type oxidizer as would be provided by the above-mentioned concentrations of hydrogen peroxide. We also note that the polishing selectivity of TaN to Ta was fairly consistent at about 1.4 for all samples. This is beneficial because the two are so close. Generally, barrier layers may comprise Ta and TaN layers, and the compositions of the present invention allow fairly equal (within 50%) removal of both components of a barrier layer.

In Table 5, Examples 20, 21, 22 and 23 show the effect of changing the concentration of benzenesulfonic acid between 0.5 weight %, 1 weight %, 1.5 weight % and 2 weight % at a fixed 1 weight % concentration of hydrogen peroxide, and at a low abrasive concentration of 0.1 weight %. As the data show, as the concentration of benzenesulfonic acid increased from 0.5 weight % to 2 weight %, produced no measurable change in the removal rates of Black Diamond®, PETEOS, and copper. However, as the concentration of benzenesulfonic acid increased to 1.5 weight % and 2 weight %, the tantalum nitride increased significantly to 182 Å/min and 393 Å/min respectively. Again this data point to unique combination of hydrogen peroxide and benzenesulfonic acid and specific ratio of the two additives in enhancing tantalum and/or tantalum nitride removal rates, and providing tunability for the removal of tantalum and/or tantalum nitride versus copper, PETEOS, Black Diamond®.

TABLE 1-a

Controlling Tunability of Copper, PETEOS, Tantalum Nitride, and Black Diamond ® Blanket Wafer Removal Rates and Removal Rate Selectivities Using Mixtures of Benzenesulfonic acid with Hydrogen Peroxide - Comparative Examples

|  | Comparative Example 1 | Comparative Example 2 | Comparative Example 3 | Comparative Example 4 |
|---|---|---|---|---|
| Potassium stabilized silica (weight % solids) | 3 | 3 | 3 | 3 |
| Potassium hydroxide (weight %) | 0.82 | 0.85 | 0.85 | 0.76 |
| Benzenesulfonic acid (weight %) | 0 | 0 | 0 | 2 |
| Hydrogen peroxide (weight %) | 1 | 5 | 7.5 | 0 |
| Deionized Water | Balance | Balance | Balance | Balance |
| pH | 11.2 | 8.5 | 9.6 | 10.2 |
| Copper removal rate at 2.0 psi (Å/min) | 64 | 41 | 98 | 208 |
| PETEOS removal rate at 2.0 psi (Å/min) | About zero* | About zero* | About zero* | 227 |
| Tantalum nitride removal rate at 2.0 psi (Å/min) | 222 | 128 | 179 | 289 |
| Black Diamond ® removal rate at 2.0 psi (Å/min) | 316 | 92 | 231 | 594 |
| TaN:BD1 Sel at 2.0 psi | 0.7 | 1.4 | 0.8 | 0.5 |
| TaN:Cu Sel at 2.0 psi | 3.5 | 3.1 | 1.8 | 1.4 |
| TaN:PETEOS Sel at 2.0 psi | * | * | * | 1.3 |
| Cu:BD1 Sel at 2.0 psi | 0.2 | 0.4 | 0.4 | 0.4 |
| Cu:PETEOS Sel at 2.0 psi | * | * | * | 0.9 |

TABLE 1-b

Controlling Tunability of Copper, PETEOS, Tantalum Nitride, and Black Diamond ® Blanket Wafer Removal Rates and Removal Rate Selectivities Using Mixtures of Benzenesulfonic acid with Hydrogen Peroxide - Examples 5, 6, 7

|  | Example 5 | Example 6 | Example 7 |
|---|---|---|---|
| Potassium stabilized silica (weight % solids) | 3 | 3 | 3 |
| Potassium hydroxide (weight %) | 0.75 | 0.76 | 0.75 |
| Benzenesulfonic acid (weight %) | 2 | 2 | 2 |
| Hydrogen peroxide (weight %) | 1 | 2.5 | 5 |
| Deionized Water | Balance | Balance | Balance |
| pH | 9.5 | 9.1 | 8.5 |
| Copper removal rate at 2.0 psi (Å/min) | 118 | 92 | 77 |
| PETEOS removal rate at 2.0 psi (Å/min) | 188 | 178 | 153 |
| Tantalum nitride removal rate at 2.0 psi (Å/min) | 520 | 558 | 604 |
| Black Diamond ® removal rate at 2.0 psi (Å/min) | 626 | 628 | 553 |
| TaN:BD1 Sel at 2.0 psi | 0.8 | 0.9 | 1.1 |
| TaN:Cu Sel at 2.0 psi | 4.4 | 6.1 | 7.8 |
| TaN:PETEOS Sel at 2.0 psi | 2.8 | 3.1 | 3.9 |
| Cu:BD1 Sel at 2.0 psi | 0.2 | 0.1 | 0.1 |
| Cu:PETEOS Sel at 2.0 psi | 0.6 | 0.5 | 0.5 |

* The PETEOS removal rate is zero within experimental error

TABLE 2

Controlling Tunability of Copper, PETEOS, Tantalum Nitride, and Black Diamond ® Blanket Wafer Removal Rates and Removal Rate Selectivities Using Different Concentration of Benzenesulfonic acid at Fixed Concentration of 5% Hydrogen Peroxide

|  | Example 8 | Example 9 | Example 7 | Example 10 |
|---|---|---|---|---|
| Potassium stabilized silica (weight % solids) | 3 | 3 | 3 | 3 |
| Potassium hydroxide (weight %) | 0.20 | 0.38 | 0.76 | 0.82 |
| Benzenesulfonic acid (weight %) | 0.5 | 1 | 2 | 3 |
| Hydrogen peroxide (weight %) | 5 | 5 | 5 | 5 |
| Deionized Water | Balance | Balance | Balance | Balance |
| pH | 8.7 | 8.6 | 8.5 | 8.6 |
| Copper removal rate at 2.0 psi (Å/min) | 43 | 104 | 77 | 63 |
| PETEOS removal rate at 2.0 psi (Å/min) | 102 | 194 | 153 | 128 |
| Tantalum nitride removal rate at 2.0 psi (Å/min) | 353 | 675 | 604 | 481 |
| Black Diamond ® removal rate at 2.0 psi (Å/min) | 451 | 623 | 553 | 504 |
| TaN:BD1 Sel at 2.0 psi | 0.8 | 1.1 | 1.1 | 1.0 |
| TaN:Cu Sel at 2.0 psi | 8.2 | 6.5 | 7.8 | 7.6 |
| TaN:PETEOS Sel at 2.0 psi | 3.5 | 3.5 | 3.9 | 3.8 |
| Cu:BD1 Sel at 2.0 psi | 0.1 | 0.2 | 0.1 | 0.1 |
| Cu:PETEOS Sel at 2.0 psi | 0.4 | 0.5 | 0.5 | 0.5 |

TABLE 3

Controlling Tunability of Copper, PETEOS, Tantalum Nitride, and Black Diamond ® Blanket Wafer Removal Rates and Removal Rate Selectivities Using different Concentrations of Abrasive with Fixed Amount of Benzenesulfonic acid (1 weight %) and Hydrogen Peroxide (1 weight %)

|  | Example 11 | Example 12 | Example 13 | Example 14 |
|---|---|---|---|---|
| Potassium stabilized silica (weight % solids) | 0.5 | 1.5 | 10 | 20 |
| Potassium hydroxide (weight %) | 0.28 | 0.20 | 0.10 | 0.05 |
| Benzenesulfonic acid (weight %) | 1 | 1 | 1 | 1 |
| Hydrogen peroxide (weight %) | 1 | 1 | 1 | 1 |
| Deionized Water | Balance | Balance | Balance | Balance |
| pH | 9.2 | 9.8 | 9.8 | 10.0 |
| Copper removal rate at 2.0 psi (Å/min) | 64 | 84 | 210 | 384 |
| PETEOS removal rate at 2.0 psi (Å/min) | 20 | 63 | 495 | 1003 |
| Tantalum nitride removal rate at 2.0 psi (Å/min) | 187 | 262 | 456 | 508 |
| Black Diamond ® removal rate at 2.0 psi (Å/min) | 190 | 295 | 808 | 1269 |
| TaN:BD1 Sel at 2.0 psi | 1.0 | 0.9 | 0.6 | 0.4 |
| TaN:Cu Sel at 2.0 psi | 2.9 | 3.1 | 2.2 | 1.3 |
| TaN:PETEOS Sel at 2.0 psi | 9.4 | 4.2 | 0.9 | 0.5 |
| Cu:BD1 Sel at 2.0 psi | 0.3 | 0.3 | 0.3 | 0.3 |
| Cu:PETEOS Sel at 2.0 psi | 3.2 | 1.3 | 0.4 | 0.4 |

TABLE 4

Effect of pH on the Tunability of Copper, PETEOS, Tantalum, Tantalum Nitride, and Black Diamond ® Blanket Wafer Removal Rates and Removal Rate Selectivities Using Fixed Amounts of Benzenesulfonic acid, and Hydrogen Peroxide

|  | Example 15 | Example 16 | Example 17 | Example 18 | Example 19 |
|---|---|---|---|---|---|
| Potassium stabilized silica (weight % solids) | 10 | 10 | 10 | 10 | 10 |
| Potassium hydroxide (weight %) | 0.25 | 0.27 | 0.32 | 0.36 | 0.46 |
| Benzenesulfonic acid (weight %) | 1 | 1 | 1 | 1 | 1 |
| Hydrogen peroxide (weight %) | 1 | 1 | 1 | 1 | 1 |
| Deionized Water | Balance | Balance | Balance | Balance | Balance |
| pH | 6.2 | 7.1 | 8.7 | 9.4 | 9.9 |
| Copper removal rate at 2.0 psi (Å/min) | 732 | 577 | 334 | 263 | 214 |
| PETEOS removal rate at 2.0 psi (Å/min) | 658 | 583 | 624 | 600 | 643 |
| Tantalum nitride removal rate at 2.0 psi (Å/min) | 892 | 853 | 695 | 707 | 738 |
| Black Diamond ® removal rate at 2.0 psi (Å/min) | 524 | 587 | 793 | 971 | 1083 |
| Tantalum removal rate at 2.0 psi (Å/min) | 657 | 598 | 476 | 482 | 576 |
| TaN:BD1 Sel at 2.0 psi | 1.8 | 1.5 | 0.9 | 0.7 | 0.7 |
| TaN:Cu Sel at 2.0 psi | 1.2 | 1.5 | 2.1 | 2.7 | 3.5 |
| TaN:PETEOS Sel at 2.0 psi | 1.4 | 1.5 | 1.1 | 1.2 | 1.2 |
| Cu:BD1 Sel at 2.0 psi | 1.4 | 1.0 | 0.4 | 0.3 | 0.2 |
| Cu:PETEOS Sel at 2.0 psi | 1.1 | 1.0 | 0.5 | 0.4 | 0.3 |

TABLE 5

Effect of Benzenesulfonic acid Concentration on the Tunability of Copper, PETEOS, Tantalum, Tantalum Nitride, and Black Diamond ® Blanket Wafer Removal Rates and Removal Rate Selectivities Using Fixed Amounts of Abrasive (0.1 weight %) and Hydrogen Peroxide (1 weight %)

|  | Example 20 | Example 21 | Example 22 | Example 23 |
|---|---|---|---|---|
| Potassium stabilized silica (weight % solids) | 0.1 | 0.1 | 0.1 | 0.1 |
| Potassium hydroxide (weight %) | 0.20 | 0.37 | 0.55 | 0.73 |
| Benzenesulfonic acid (weight %) | 0.5 | 1 | 1.5 | 2 |
| Hydrogen peroxide (weight %) | 1 | 1 | 1 | 1 |
| Deionized Water | Balance | Balance | Balance | Balance |
| pH | 9.1 | 9.1 | 9.1 | 9.1 |
| Copper removal rate at 2.0 psi (Å/min) | 11 | 13 | 6 | 8 |
| PETEOS removal rate at 2.0 psi (Å/min) | About zero* | About zero* | 10 | About zero* |
| Tantalum nitride removal rate at 2.0 psi (Å/min) | 81 | 109 | 182 | 393 |
| Black Diamond ® removal rate at 2.0 psi (Å/min) | 33 | 23 | 21 | About zero* |
| Tantalum removal rate at 2.0 psi (Å/min) | 50 | 71 | 24 | 256 |

*The PETEOS and Black Diamond ® removal rate is zero within experimental error

The present invention has been set forth with regard to several preferred embodiments, however the present invention's full scope should not be limited to the disclosure of those embodiments, but rather the full scope of the present invention should be ascertained from the claims which follow.

What is claimed is:

1. A chemical-mechanical planarization composition comprising: A) an abrasive; B) about 0.1% to about 8% by weight of a per-type oxidizing compound; C) benzenesulfonic acid and/or a salt thereof; D) a corrosion inhibitor; and (E) water; wherein the composition has a pH ranging from about 5 to 11, and wherein the composition is substantially free of an amino acid having two or more nitrogen atoms,
    wherein said corrosion inhibitor is selected from the group consisting of 1,2,4-triazole, benzotriazole, 6-tolylytriazole, tolyltriazole derivatives, 1-(2,3-dicarboxypropyl) benzotriazole, branched-alkylphenolsubstituted-benzotriazoles, N-acyl-N-hydrocarbonoxylalkyl aspartic acid, and mixtures thereof.

2. The composition of claim 1, further comprising a surfactant selected from the group consisting of nonionic, anionic, cationic, amphoteric and mixtures thereof.

3. The composition of claim 2, wherein said surfactant is present in a concentration from about 0.0001% by weight to about 1.5% by weight.

4. The composition of claim 1, wherein said corrosion inhibitor is present in a concentration from about 1 ppm to about 7000 ppm.

5. The composition of claim 1 further comprising a carboxylic acid.

6. The composition of claim 1 further comprising a chelating agent, wherein said chelating agent is selected from the group consisting of ethylenediaminetetraacetic acid, N-hydroxyethylethylenediaminetriacetic acid, nitrilotriacetic acid, diethyleneenetriaminepentacetic acid, ethanoldiglycinate, glycine, tricine, citric acid, 2,3-butanedione dioxime, and mixtures thereof.

7. The composition of claim 6, wherein said chelating agent is present in an amount from about 0.1% by weight to about 2% by weight.

8. The composition of claim 1, further comprising one or more of: a) a base selected from non-polymeric nitrogen containing compounds; and b) an acid that is not sulfonic acid.

9. The composition of claim 8, wherein said non-polymeric nitrogen containing compounds are selected from the group consisting of ammonium hydroxide, monoethanolamine, diethanolamine, triethanolamine, diethyleneglycolamine, N-hydroxyethylpiperazine, and mixtures thereof.

10. The composition of claim 1, further comprising one or more of a) hydroxylamine; and b) an alkyl-substituted hydroxylamine or salt thereof.

11. The composition of claim 10, wherein the hydroxylamine or the alkyl-substituted hydroxylamine or a salt thereof is present in an amount from about 0.01% by weight to about 0.1% by weight.

12. The composition of claim 1 further comprising a salt, wherein said salt is selected from the group consisting of ammonium persulfate, potassium persulfate, potassium sulfite, potassium carbonate, ammonium nitrate, potassium hydrogen phthalate, hydroxylamine sulfate, and mixtures thereof; and wherein the salt is present in an amount from about 0.02% by weight to about 5% by weight.

13. The composition of claim 1, wherein the abrasive is colloidal silica or surface-modified colloidal silica.

14. The composition of claim 13, wherein the colloidal silica or surface modified colloidal silica is present in an amount from about 0.001% by weight to about 30% by weight.

15. The composition of claim 1, wherein the benzenesulfonic acid is present in an amount from about 0.5% by weight to about 4% by weight.

* * * * *